United States Patent
Stadler et al.

(10) Patent No.: US 8,093,689 B2
(45) Date of Patent: Jan. 10, 2012

(54) ATTACHMENT MEMBER FOR SEMICONDUCTOR SENSOR DEVICE

(75) Inventors: Wolfgang Stadler, Munich (DE); Harald Gossner, Riemerling (DE); Reinhold Gaertner, Starnberg (DE)

(73) Assignee: Infineon Technologies AG, Neubiberg (DE)

( * ) Notice: Subject to any disclaimer, the term of this patent is extended or adjusted under 35 U.S.C. 154(b) by 1066 days.

(21) Appl. No.: 11/772,272

(22) Filed: Jul. 2, 2007

(65) Prior Publication Data
US 2009/0012439 A1    Jan. 8, 2009

(51) Int. Cl.
*H01L 23/58* (2006.01)
(52) U.S. Cl. .............................. 257/629; 257/632
(58) Field of Classification Search ........... 602/41; 257/632, 693, 629; 600/549; 73/146.2
See application file for complete search history.

(56) References Cited

U.S. PATENT DOCUMENTS

| | | | |
|---|---|---|---|
| 6,075,289 A | | 6/2000 | Distefano |
| 7,141,839 B2 * | | 11/2006 | Thomas et al. ............... 257/252 |
| 2005/0186697 A1 * | | 8/2005 | Yang ............................... 438/49 |
| 2008/0061323 A1 * | | 3/2008 | Yazawa et al. ................ 257/253 |
| 2008/0150118 A1 * | | 6/2008 | Van Veen et al. ............. 257/688 |

FOREIGN PATENT DOCUMENTS

| | | |
|---|---|---|
| DE | 4014572 A1 | 11/1991 |
| DE | 4101554 A1 | 7/1992 |
| DE | 102007020656 A1 | 11/2008 |
| WO | 2006051426 A2 | 5/2006 |

* cited by examiner

*Primary Examiner* — Michael A. Brown
(74) *Attorney, Agent, or Firm* — Infineon Technologies AG Patent Department (57) ABSTRACT

A semiconductor sensor device is electrically coupled to an object. An attachment member attaches the semiconductor sensor device to the object. The attachment member comprises a first conductive contact region and a second conductive contact region. An insulating portion is electrically isolates the semiconductor sensor device from the first conductive contact region and second conductive contact region.

21 Claims, 7 Drawing Sheets

ATTACHMENT MEMBER FOR SEMICONDUCTOR SENSOR DEVICE

BACKGROUND

Semiconductor sensor devices are used in everyday life and applications include automotive, industry and medicine. Medical sensors may be used for measuring pulse, body temperature, electrocardiographs (ECG), blood, tissue and/or skin parameters. Automotive sensors may be used for measuring speed, pressure, humidity or liquid levels. Industrial sensors may be used for measuring distance, position, color or contrast.

Semiconductor devices are particularly sensitive to damage from electrostatic discharge (ESD). This is due to the fact that these components are composed of micro-miniature traces and structures of alternating layers that may be insulative, conductive or semi-conductive. Rapid ESD may cause damage to these structures and thus semiconductor sensor devices need to be protected from ESD. ESD, e.g., static electricity, may occur when a user and a sensor are at different voltage potentials. The user may be exposed to environmental conditions that cause a great increase in potential in comparison to an object that is at a different potential or that is grounded. When the user touches the sensor at a great voltage disparity, e.g. when affixing the sensor to an object, a sudden discharge may occur. The sudden discharge may change the electrical characteristics and may cause operational failure of the semiconductor sensor device, both temporary and permanent.

DETAILED DESCRIPTION

Many of the various disclosed embodiments relate to an apparatus including a semiconductor sensor device and further including an attachment member for the semiconductor sensor device and a method of manufacturing. Specific details of certain embodiments of the invention are set forth in the following description and in FIGS. 1 through 11 to provide a thorough understanding of such embodiments. One skilled in the art, however, will understand that other embodiments are possible, and that many embodiments may be practiced without several of the details described herein.

Figure 1:
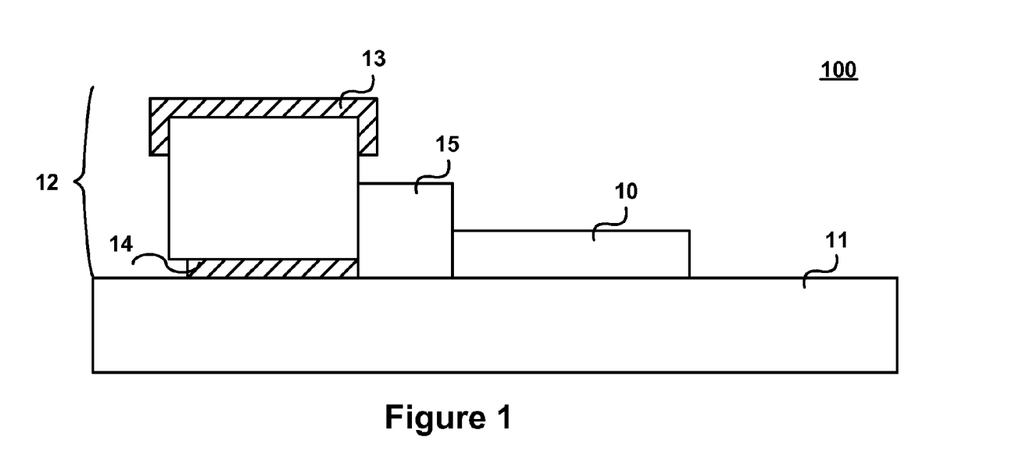
FIG. 1 shows a cross-sectional view of an exemplary apparatus for attachment of a semiconductor sensor device according to the present invention.

FIG. 1 shows a cross-sectional view of an apparatus 100 which includes a semiconductor sensor device 10 that may be electrically coupled to an object 11 in order to sense parameters of the object 11. The semiconductor sensor device 10 may be affixed to the object 11 by way of an attachment member 12. The attachment member 12 includes a first conductive contact region 13 and a second conductive contact region 14. An insulating portion 15 electrically isolates the semiconductor sensor device 10 from the first conductive contact region 13 and from the second conductive contact region 14.

The semiconductor sensor device 10 may be susceptible to ESD. An ESD event may occur, for example, when an electrostatically charged human affixes the semiconductor sensor device 10 to the object 11. The attachment member 12 together with the insulating portion 15 provides ESD protection capabilities for the sensor device 10. The first conductive contact region 13 and the second conductive contact region 14 provide a low impedance discharge path for electrostatic charges. When the sensor 10 gets affixed to the object 11 by an electrostatically charged human the first conductive contact region 13 is manipulated by the human and the second conductive contact region 14 interfaces the object 11. When a threshold electrical potential is exceeded, as would occur during an ESD event, the discharge current flows from the first conductive contact region 13 to the second conductive contact region 14 and the electrostatic charges discharge safely. More specifically, the semiconductor sensor device 10 remains unaffected. Hence, through the first conductive contact region 13 and the second conductive contact region 14 a protective pathway is provided for an ESD current. Thus, the semiconductor sensor device 10 is electrically isolated from the contact regions 13 and 14 by the insulation portion 15. This isolation substantially prevents the sensor device 10 from degradation or destruction.

The threshold level or breakdown voltage is defined by the electrical potential where discharge current starts to flow from the first conductive contact region 13 to the second conductive contact region 14. One factor affecting the breakdown voltage is the electrical conductivity between the first contact region 13 and the second contact region 14. In general, a lower electrical conductivity requires a higher breakdown voltage to occur. The breakdown voltage across the first region 13 and the second region 14 may be substantially less than the breakdown voltage of the sensor device 10. Several factors may affect the electrical conductivity between the first contact region 13 and the second contact region 14. These factors include bringing the first contact region 13 and the second contact region 14 into electrical contact with each other, thereby forming a conductive path.

Figure 2:
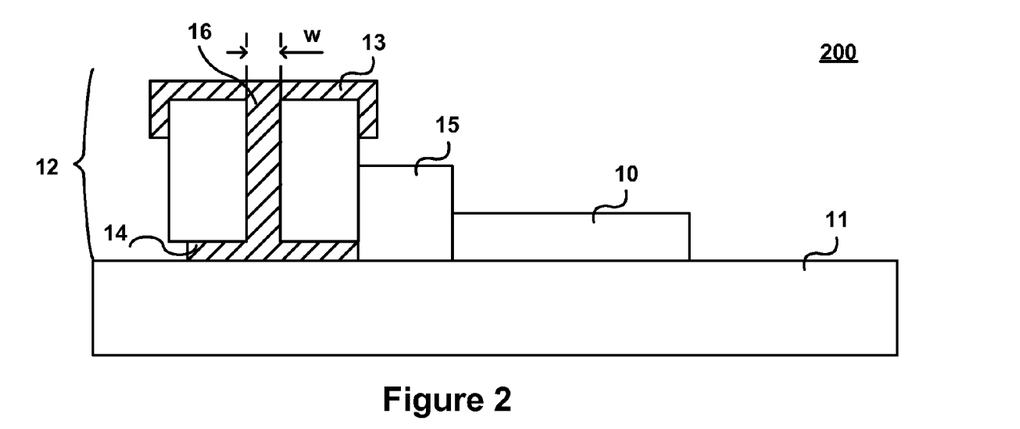
FIG. 2 shows a cross-sectional view of an exemplary apparatus for attachment of a semiconductor sensor device, with a via in an attachment member.

As shown in FIG. 2 the attachment member 12 of apparatus 200 may include a via 16 which extends from the first conductive contact region 13 to the second contact region 14 thereby connecting the first conductive contact region 13 to the second contact region 14. The electrical conductivity between the first contact region 13 and the second contact region 14 may be affected by the dimensions of via 16, for example by the width w of via 16. In general, enlarging width w increases the electrical conductivity. The electrical conductivity may also be increased if the number of vias in the attachment member 12 is increased.

Figure 3:
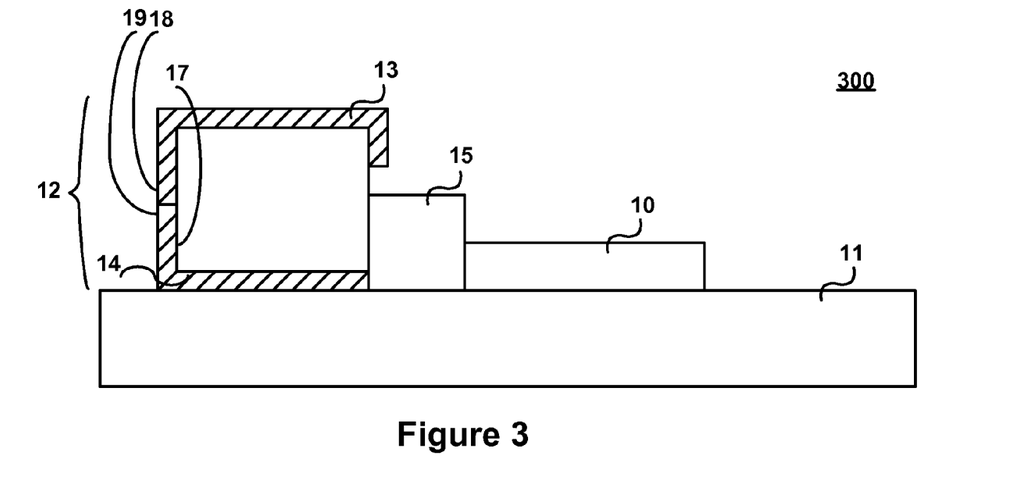
FIG. 3 shows a cross-sectional view of an exemplary apparatus for attachment of a semiconductor sensor device, with a first end of a first conductive contact region connected to a first end of a second conductive contact region.

FIG. 3 shows an alternative way of bringing the first contact region 13 and the second contact region 14 into electrical contact with each other. At a first end 17 of the attachment member 12 of apparatus 300 a first end 18 of the first conductive contact region 13 is at least partially connected to a first end 19 of the second conductive contact region 14. The form of the transition from the first conductive contact region 13 to the second contact region 14 may affect the electrical conductivity. For example, enlarging the common contact area between the first conductive contact region 13 and the second contact region 14 increases the electrical conductivity. The common contact area and therefore the electrical conductivity may be further increased by connecting at a further end of the attachment member 12 a further end of the first conductive contact region 13 to a further end of the second conductive contact region 14. Alternatively, the first contact region 13 is connected to the second contact region 14 at many points so that the attachment member 12 is partially surrounded by the first contact region 13 and the second contact region 14.

Other factors affecting the electrical conductivity between the first conductive contact region 13 and the second conductive contact region 14 include the electrical properties of the conductive contact regions 13 and 14. The conductive contact regions 13, 14 may be manufactured by evaporating a metal layer on the attachment member 12.

The insulating portion 15 isolates the semiconductor sensor device 10 from the conductive contact regions 13 and 14 in order to prevent ESD current flowing through sensor device 10 and therefore to protect it against damage caused by ESD.

Figure 4:
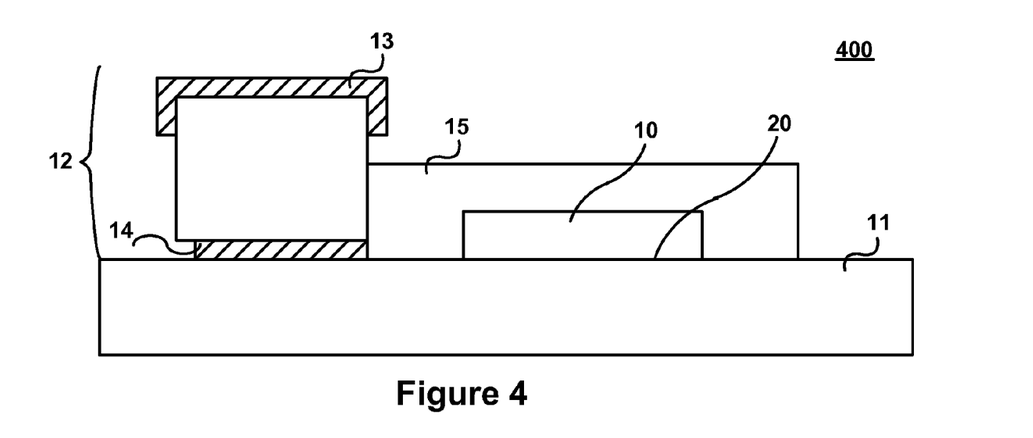
FIG. 4 shows a cross-sectional view of an exemplary apparatus for attachment of a semiconductor sensor device, with an insulating portion partially surrounding the semiconductor sensor device.

In FIG. 1 the insulating portion 15 is placed between the attachment member 12 and the semiconductor sensor device 10. Alternatively, the semiconductor sensor device 10 may be partially or completely surrounded by the insulating portion 15. In FIG. 4 the semiconductor sensor device 10 of apparatus 400 is partially surrounded by the insulating portion 15. All parts except the area 20 where the sensor device 10 contacts the object 11 are surrounded by the insulating portion 15. Enclosing the sensor device 10 in the insulating portion 15 may improve the mechanical stability of the apparatus 400 and may simplify the manufacturability of apparatus 400.

Figure 5:
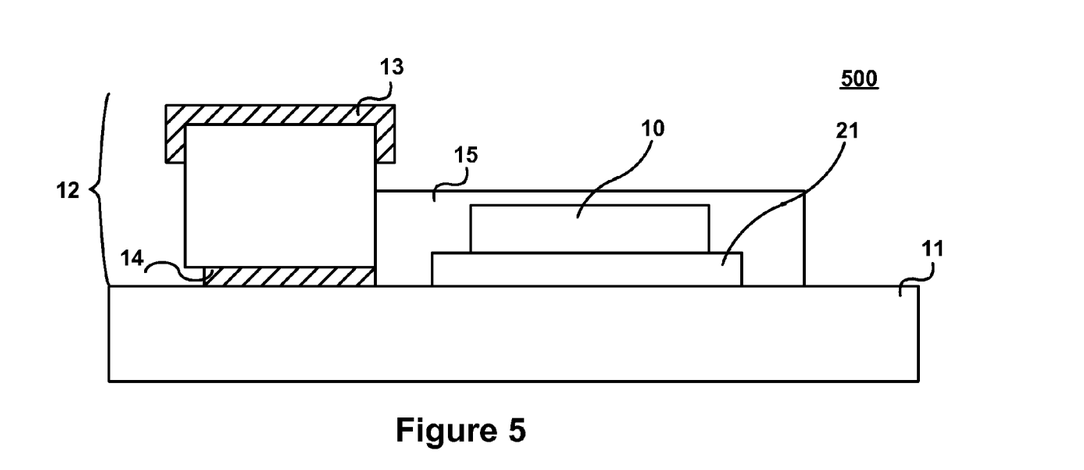
FIG. 5 shows a cross-sectional view of an exemplary apparatus for attachment of a semiconductor sensor device, with an interconnect portion coupled to the semiconductor sensor device.

With reference to FIG. 5 the semiconductor sensor device 10 is completely enclosed within the insulating portion 15. The electrical contact between the sensor device 10 and the object 11 is established by an interconnect portion 21 which is placed between the sensor device 10 and the object 11 and which contacts the object 11. To establish an electrical connection between the sensor device 10 and the interconnect portion 21 the sensor device 10 may be mounted to a surface of the interconnect portion 21. Alternatively, the sensor device 10 may be placed separated from the interconnect portion 21 and one or more electrical connection lines may connect the sensor device 10 to the interconnect portion 21.

Figure 6:
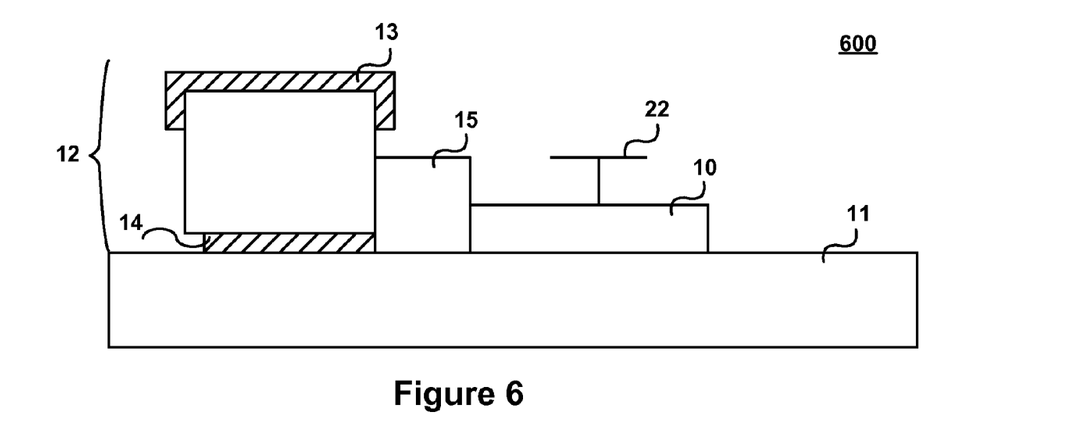
FIG. 6 shows a cross-sectional view of an exemplary apparatus for attachment of a semiconductor sensor device, with an antenna coupled to the semiconductor sensor device.

With reference to FIG. 6 the semiconductor sensor device 10 is electrically coupled to an antenna 22 to transmit data measured by the sensor device 10 to a remote receiver. The receiver may be located at a remote location and may evaluate, monitor and/or display data that it received from the sensor device 10. To ensure enough transmitting power for the RF signal to reach the remote receiver it has to be avoided that the antenna 22 is shielded by the conductive contact regions 13, 14. Therefore, the antenna 22 must not be fully surrounded by the conductive contact regions 13, 14.

A signal processing block, a control block and/or an RF transceiver block may be coupled to the sensor device 10 and to the antenna 22 to form a configuration of blocks. Furthermore, a battery may be coupled to the sensor device 10 to power it. In the signal processing block filtering, amplification and/or data conversion of the analog signal coming from the sensor device 10 may be performed. The control block may contain a processor and/or memory to process and store data coming from the signal processing block and to control the operation of the configuration. The RF transceiver block may be coupled to the signal processing block or to the control block to transmit data measured by the sensor device 10 to a remote receiver. The data may be transferred via an RF signal from the antenna 22 using any appropriate protocol including Bluetooth, UWB, and proprietary protocols. The sensor, the signal processing block, the control block and the RF transceiver block may be implemented on a single semiconductor device. However it is also possible that the sensor or some of the other blocks are implemented on distinct semiconductor devices.

Figure 7:
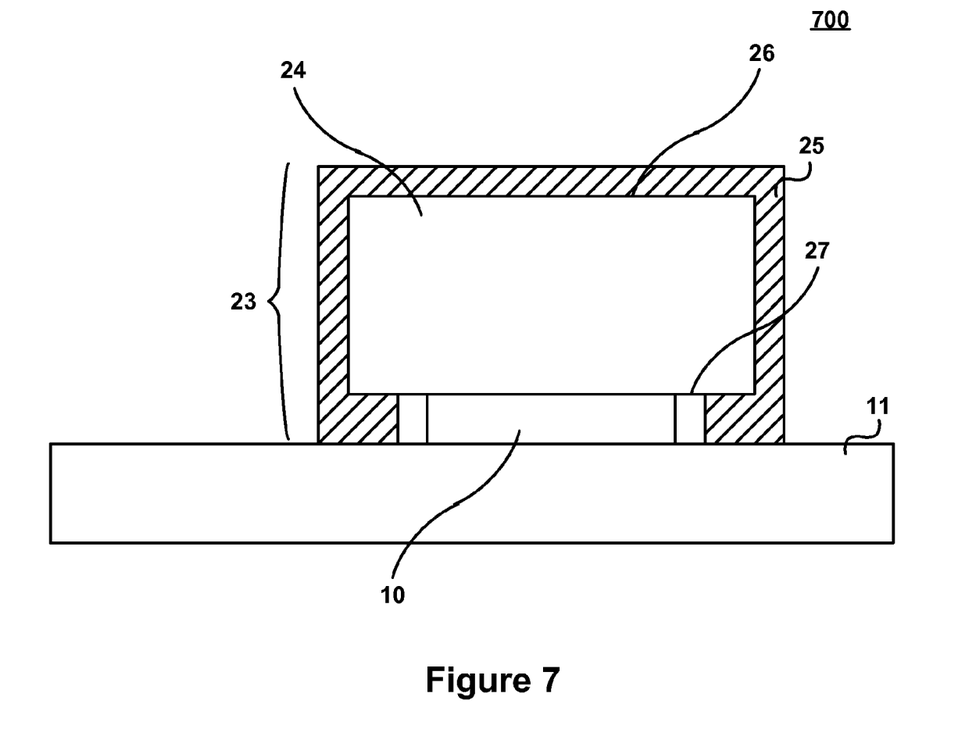
FIG. 7 shows a cross-sectional view of an exemplary apparatus for attachment of a semiconductor sensor device according to the present invention.

FIG. 7 shows an alternative way of providing ESD protection for a semiconductor sensor device 10 that may be electrically coupled to an object 11 to sense parameters of the object 11. The semiconductor sensor device 10 may be affixed by a human to the object 11 by way of an attachment member 23. The attachment member 23 includes an insulating portion 24 and a conductive region 25. The conductive region 25 extends from a first surface 26 of the insulating portion 24 to a second surface 27 of the insulating portion 24 and at least partially surrounds the insulating portion 24. When the sensor device 10 gets affixed to the object 11 the conductive region 25 at the first surface 26 is manipulated by the human and the conductive region 25 at the second surface 27 interfaces the object 11. If the human is electrostatically charged an ESD event may occur when affixing the sensor device 10 to the object 11. In case of an ESD event the discharge current flows from the conductive region 25 at the first surface 26 to conductive region 25 at the second surface 27. The electrostatic charges discharge around the insulating portion 24 without affecting the ESD sensitive sensor device 10 that is isolated from the conductive region 25 by the insulating portion 24.

As described in relation to FIGS. 2 and 3 above, the electrical conductivity between the conductive region 25 at the first surface 26 and the conductive region 25 at the second surface 27 may affect the breakdown voltage. The electrical conductivity between the conductive region 25 at the first surface 26 and the conductive region 25 at the second surface 27 may be increased by adding one or more vias which extend from the first surface 26 through the insulating portion 24 to the second surface 27, thus connecting two points of the conductive region 25.

The sensor device 10 may be mounted on the surface of the insulating portion 24 to contact the object 11 directly. Alternatively, as described in relation to FIGS. 4 and 5 above, the sensor device 10 may be partially or completely surrounded by the insulating portion 24.

As described in relation to FIG. 6 above, the sensor device 10 may be coupled to an antenna. Both, the sensor device 10 and the antenna, may be completely surrounded by the insulating portion 24. In order to ensure the transfer of the RF signal from the antenna to the remote receiver the shielding of the antenna should be avoided. This may be accomplished by not covering the complete area around the antenna with the conductive region 25. There may be a gap in form of a window in the conductive region 25 that allows transfer of the RF signal from the antenna to the remote receiver.

With reference to FIGS. 1 to 7 above, the attachment member 12, 23 may be provided on at least one side with an adhesive that allows a human to stick the apparatus to the object 11. The adhesive may be conductive and it may provide a close contact of the sensor device 10 or the interconnect portion 21 to the object 11 even during movement of the object 11. Furthermore, the adhesive may be removed from the object 11 without damaging the object 11. Beside adhesive there are many alternative ways of fastening the apparatus to the object 11, e.g. screw, nail, clip or snap-on connection.

The apparatus described in FIGS. 1 to 7 above may be implemented in a variety of applications. For example, it might be implemented in the medical field, in the automotive field, in industrial processes or in home and office equipment. In the medical field the apparatus may enable a non-intrusive, continuous monitoring of multiple vital signs of a patient like ECG, temperature, pulse, blood glucose and oxygen levels. In other fields of application the apparatus may be used to measure speed, pressure, humidity, liquid levels, distance or color.

Figure 8:
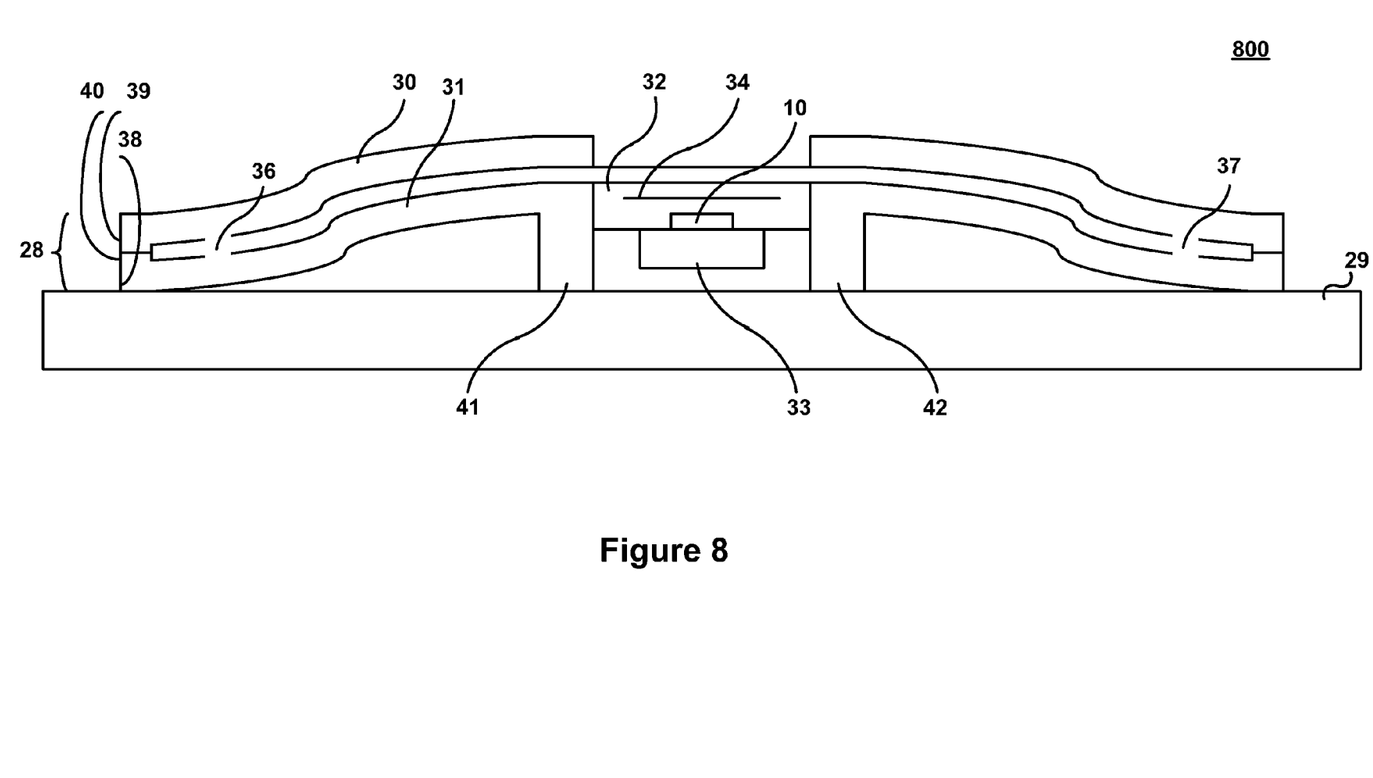
FIG. 8 shows a cross-sectional view of an exemplary apparatus for application of a bandage to a patient.

In the medical field a bandage may be used to attach a semiconductor sensor device to the body of a patient. With reference to FIG. 8 a bandage 800 resembles a conventional plaster for covering a wound or other minor injury. The bandage 800 includes a semiconductor sensor device 10 and an attachment member 28 to affix the sensor device 10 to a body 29. The attachment member 28 has a first conductive contact region 30 on its outer surface and a second conductive contact region 31 on its inner surface. Like for a conventional plaster the inner surface of the attachment member 28 may be at least partially provided with an adhesive that allows a user to stick the plaster to the skin of a patient. An insulating portion 32 electrically isolates the sensor device 10 from the first conductive contact region 30 and from the second conductive contact region 31. The insulating portion 32 may provide a substrate for the semiconductor sensor device 10 and the semiconductor sensor device 10 may be partially or completely surrounded by the insulating portion 32. As described for FIG. 5 above an interconnect portion 33 may be placed between the insulating portion 32 and the body 29. As described for FIG. 6 above the sensor device 10 may be electrically coupled to an antenna 34 and/or other functional blocks and devices that process data coming from the sensor device 10. Some or all of these blocks and devices may be supported by the insulating portion 32 as a substrate.

Figure 9:
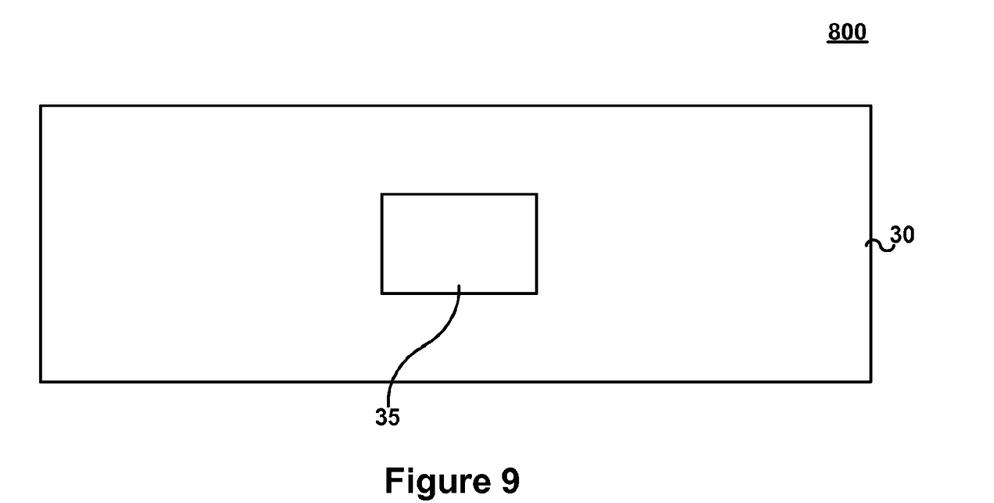
FIG. 9 shows a top view of an exemplary apparatus for application of a bandage to a patient.

FIG. 9 shows a top view of the bandage 800 of FIG. 8 where the first conductive contact region 30 covers almost the complete outer surface of the attachment member 28. There is a gap 35 in the first conductive contact region 30 that may ensure the transfer of RF signals from the antenna 34.

Figure 10:
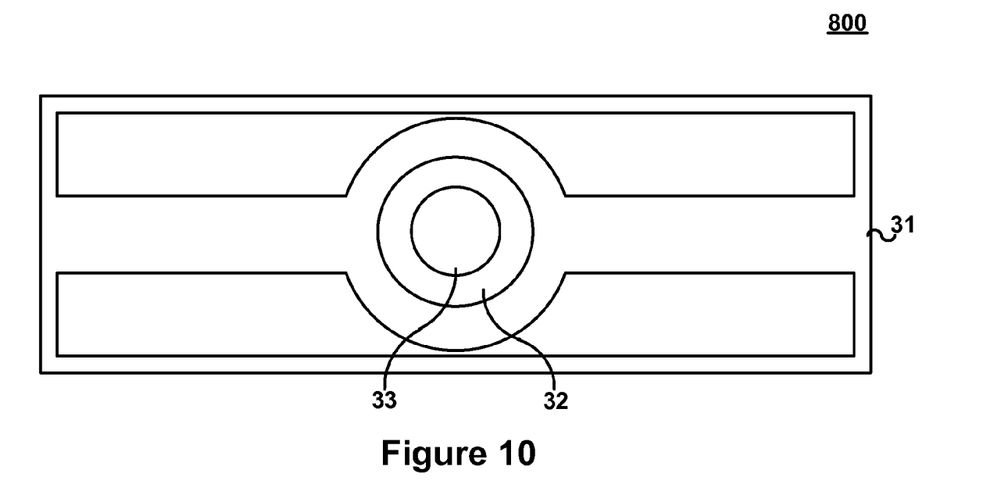
FIG. 10 shows a bottom view of an exemplary apparatus for application of a bandage to a patient.

FIG. 10 shows a bottom view of the bandage 800 of FIG. 8 where the inner surface of the attachment member 28 is partly covered by the second conductive contact region 31. The insulating portion 32 isolates the interconnect portion 33 and the sensor device 10 from the first and second conductive contact regions 30, 31.

An ESD event may occur when an electrostatically charged human affixes the semiconductor sensor device 10 to the body 29 of a patient. As described above the first conductive contact region 30 and the second conductive contact region 31 provide protection of the sensor device 10 against discharge because the discharge current flows from the first conductive contact region 30 to the second conductive contact region 31 without affecting the semiconductor sensor device 10 which is isolated by the insulating portion 32 from the first and second conductive contact regions 30, 31. As described in relation to FIG. 2 above, the electrical conductivity between the first contact region 30 and the second contact region 31 may be increased by placing one or more vias 36, 37 in the attachment member 28. The one or more vias 36, 37 extend from the first conductive contact region 30 to the second conductive contact region 31 to connect them to each other. Alternatively or additionally, the conductivity between the first contact region 30 and the second contact region 31 may be increased as described for FIG. 3 above. At a first end 38 of the attachment member 28 a first end 39 of the first conductive contact region 30 is at least partially connected to a first end 40 of the second conductive contact region 31.

The attachment member 28 may be constructed in a way that, while attaching the bandage 800 to the body 29, the second conductive contact region 31 gets in contact with the body 29 of a patient before the sensor device 10 gets electrically coupled to the body 29 of the patient. By this, in case of an ESD event during attachment of the bandage 800 discharge may take place from the first conductive contact region 30 to the second conductive contact region 31 before the sensor device 10 gets electrically coupled to the body 29. As the sensor device 10 is electrically isolated from the first and second conductive contact regions 30, 31 it will not be affected by the ESD discharge event. With reference to FIG. 8 the second conductive contact region 31 has protruding parts 41, 42. The protruding parts 41, 42 are formed by parts of the second conductive contact region 31 with increased thickness. Protruding parts may be provided in alternative ways, e.g. parts of the attachment member 28 that are mounted on the surface of the second conductive contact region 31 may have an increased thickness.

The bandage 800 may be of desired length or shape. As shown in FIG. 8 the attachment member 28 may have a butterfly shape with two wings extending from a central connecting part that includes the sensor device 10. The two wings ensure a stable connection between the sensor device 10 and the object 29 and avoid shifting of the sensor device 10 during movement of the object 29. The bandage 800 may be made of flexible material to conform to the part of the body 29 to which the bandage 800 is affixed and to allow the sensor device 10 or the interconnect portion 33 to fit tight to the body 29.

The bandage 800 may be used for long-term remote medical monitoring of persons or animals. It is possible to use an arrangement of various different autonomous sensors at various different desired locations on the body, simultaneously, for carrying out an adaptable continuous monitoring of various different physical and/or medical parameters of the body. The bandage is suitable for cable-free monitoring the physical and medical condition of ambulatory patients who do not need to be confined to a hospital or the like, but do require continuous monitoring of their condition. The bandage is also usable for cable-free monitoring of persons in the field of sports medicine and work place medicine.

Figure 11:
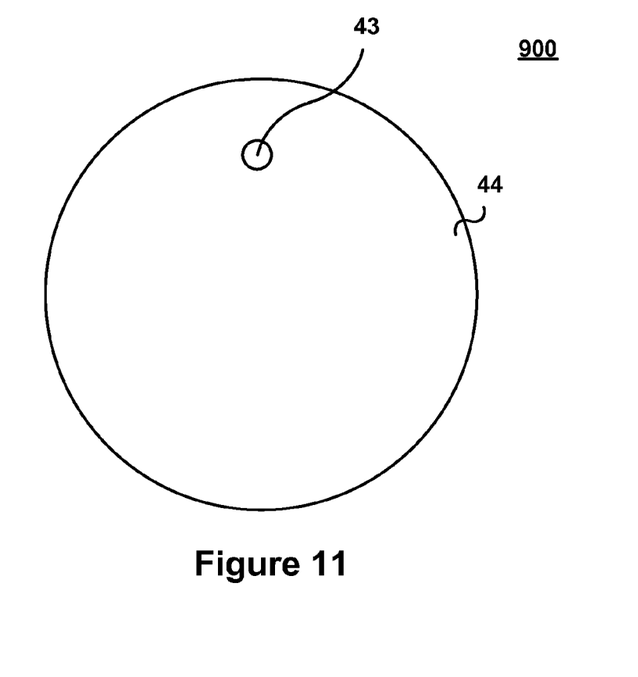
FIG. 11 shows a cross-sectional view of an exemplary apparatus for detecting tire pressure.

In the automotive field a semiconductor sensor device may be used to measure a variety of parameters, like e.g. tire pressure. With reference to FIG. 11 a pressure detector 900 includes a semiconductor pressure sensor which may detect the tire pressure and a carrier part which is configured to attach the semiconductor pressure sensor to the tire. The carrier part includes a first conductive contact region and a second conductive contact region and the semiconductor pressure sensor is electrically isolated from the first conductive contact region and from the second conductive contact region by an insulation part. In a garage during inspection of the vehicle the pressure detector 900 may be handled by a human for exchange or maintenance and the human may be electrostatically charged. The first conductive contact region is arranged to be manipulated by the human during (de-) attachment of the pressure detector and ESD discharge current may flow from the first conductive contact region to the second conductive contact region. The semiconductor pressure sensor is not affected by the ESD discharge current because it is electrically isolated from the first and second conductive contact region by the insulating part. As described for FIGS. 2 and 3 above, the electrical conductivity between the first conductive contact region and the second conductive contact region may be affected in various ways. As described for FIG. 6 above, the pressure sensor may be coupled to other functional blocks. The semiconductor pressure sensor may be powered by a long-life battery and a transmitter circuit and an antenna may be coupled the pressure sensor. When the tire pressure is below a threshold, the transmitter circuit may transmit an RF-signal via the antenna to a vehicle-based receiver. Upon receiving a low-pressure indication from the sensor, an indicator within the passenger compartment may warn the driver. Alternatively, pressure information may be transmitted periodically.

The pressure detector may be coupled to a tire valve 43 to measure the pressure inside the tire 44. It may be mechanically mounted to the body of the tire valve 43 or it may be placed apart from the tire valve 44 and the pressure detector and the tire valve 43 are coupled with each other.

With reference to FIG. 11 a pressure detector for use within a vehicle was presented. However, within the automotive field there are many other parameters that may be measured by way of a semiconductor sensor device. For example, a humidity sensor may be attached to the windscreen of a vehicle to sense and to measure the level of humidity. The humidity sensor may activate a wiper and steer the speed of the wiper of the vehicle depending on the level of humidity that was measured on the windscreen by the sensor.

Figure 12:
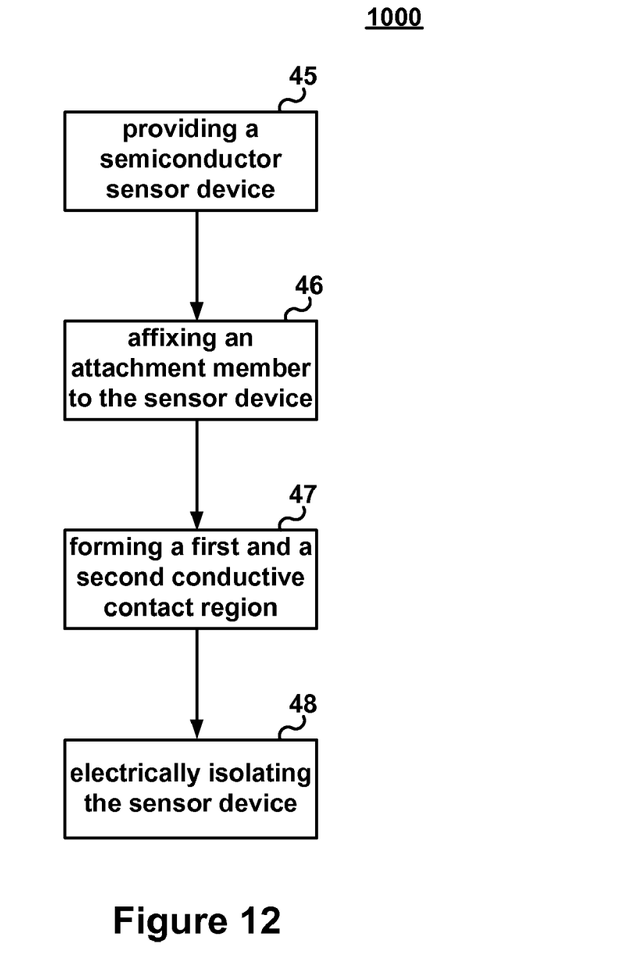
FIG. 12 illustrates a method of manufacturing that includes providing a semiconductor sensor device.

FIG. 12 illustrates a method 1000 of manufacturing. At 45, the method includes providing a semiconductor sensor device. At 46, the method includes affixing an attachment member to the semiconductor sensor device. At 47, the method includes forming a first conductive contact region and a second conductive contact region on the attachment member. At 48, the method includes electrically isolating the semiconductor sensor device from the first conductive contact region and the second conductive contact region.

At 47, the first and second conductive contact regions may be formed by evaporating a metal layer on the attachment member. Furthermore, at 47, the first and second conductive contact regions may be formed by applying conductive adhesive on the attachment member.

It should be noted that the method described herein does not have to be executed in the order described. Moreover, various activities described with respect to the method can be executed in repetitive, simultaneous, serial, or parallel fashion.

The invention claimed is:

1. An apparatus, comprising:
   a semiconductor sensor device configured to be electrically coupled to an object;
   an attachment member configured to attach the semiconductor sensor device to the object, the attachment member comprising a first conductive contact region and a second conductive contact region; and
   an insulating portion to electrically isolate the semiconductor sensor device from the first conductive contact region and second conductive contact region.

2. The apparatus of claim 1, wherein the first conductive contact region and the second conductive contact region are electrically coupled to each other.

3. The apparatus of claim 1, wherein the first conductive contact region is configured to be manipulated as the attachment member is interfaced with the object.

4. The apparatus of claim 1, wherein the second conductive contact region is to interface with the object.

5. The apparatus of claim 4, wherein the second conductive contact region comprises protruding parts configured to interface the object before the semiconductor sensor device interfaces the object.

6. The apparatus of claim 1, further comprising an antenna electrically coupled to the semiconductor sensor device.

7. The apparatus of claim 1, wherein the second conductive contact region is composed of at least adhesive material.

8. The apparatus of claim 1, wherein the semiconductor sensor device is configured to sense a vehicle parameter.

9. The apparatus of claim 1, wherein the semiconductor sensor device is configured to sense a parameter in an industrial process control.

10. The apparatus of claim 1, wherein the semiconductor sensor device is configured to sense a medical parameter.

11. The apparatus of claim 1, further comprising a via formed in the attachment member, the via to connect the first conductive contact region to the second conductive contact region.

12. The apparatus of claim 1, wherein a first end of the first conductive contact region is connected to a first end of the second conductive contact region.

13. The apparatus of claim 6, wherein the insulating portion at least partially surrounds the semiconductor sensor device and the antenna.

14. The apparatus of claim 1, further comprising an interconnect portion electrically coupled to the semiconductor sensor device, the interconnect portion being configured to electrically couple the semiconductor sensor device to the object.

15. The apparatus of claim 1, wherein the semiconductor sensor device is configured to be detachable from an object.

16. An apparatus, comprising:
   a semiconductor sensor device configured to be electrically coupled to an object;
   an attachment member configured to attach the semiconductor sensor device to the object, the attachment member comprising an insulating portion and a conductive contact region which at least partially surrounds the insulating portion and which extends from a first surface to a second surface of the insulating portion.

17. The apparatus of claim 16, further comprising an antenna electrically coupled to the semiconductor sensor device.

18. The apparatus of claim 16, wherein the insulating portion at least partially surrounds the semiconductor sensor device.

19. A method of manufacturing, comprising:
   providing a semiconductor sensor device;
   affixing an attachment member to the semiconductor sensor device;
   forming a first conductive contact region and a second conductive contact region on the attachment member; and electrically isolating the semiconductor sensor device from the first conductive contact region and the second conductive contact region.

20. The method of claim 19, wherein the forming of the first and the second conductive contact region comprises evaporating of a metal layer on the attachment member.

21. The method of claim 19, wherein the forming of the first and the second conductive contact region comprises applying conductive adhesive on the attachment member.

* * * * *